United States Patent
Nakayama et al.

(10) Patent No.: US 9,831,249 B2
(45) Date of Patent: Nov. 28, 2017

(54) METHOD OF MANUFACTURING SEMICONDUCTOR DEVICE AND NON-TRANSITORY COMPUTER-READABLE RECORDING MEDIUM

(71) Applicant: HITACHI KOKUSAI ELECTRIC INC., Tokyo (JP)

(72) Inventors: Masanori Nakayama, Toyama (JP); Hiroto Igawa, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/271,962

(22) Filed: Sep. 21, 2016

(65) Prior Publication Data

US 2017/0092647 A1 Mar. 30, 2017

(30) Foreign Application Priority Data

Sep. 28, 2015 (JP) ................. 2015-189708

(51) Int. Cl.
*H01L 21/02* (2006.01)
*H01L 27/108* (2006.01)

(52) U.S. Cl.
CPC .... *H01L 27/1085* (2013.01); *H01L 21/02175* (2013.01); *H01L 21/02244* (2013.01); *H01L 21/02247* (2013.01); *H01L 21/02252* (2013.01)

(58) Field of Classification Search
CPC .......... H01L 27/1085; H01L 21/02244; H01L 21/02175; H01L 21/02252; H01L 21/02247
USPC ........................................ 438/768
See application file for complete search history.

(56) References Cited

U.S. PATENT DOCUMENTS

2016/0336175 A1* 11/2016 Hirose ............. H01L 21/02181

* cited by examiner

*Primary Examiner* — Caleen Sullivan
(74) *Attorney, Agent, or Firm* — Volpe and Koenig, P.C.

(57) ABSTRACT

A semiconductor manufacturing method includes preparing a substrate having a metal film formed on a surface thereof; forming an oxide layer by oxidizing a surface of the metal film by plasma of a mixed gas of an oxygen-containing gas and a hydrogen-containing gas; and forming a thin film on the oxide layer by supplying at least an oxidizing gas to the substrate.

17 Claims, 9 Drawing Sheets

METHOD OF MANUFACTURING SEMICONDUCTOR DEVICE AND NON-TRANSITORY COMPUTER-READABLE RECORDING MEDIUM

BACKGROUND

Technical Field

The present invention relates to a method of manufacturing a semiconductor device and to a non-transitory computer-readable recording medium.

Related Art

With an increase in the density and performance of a semiconductor device, a capacitor process for a DRAM which is a semiconductor device has become a high aspect ratio to secure capacitance. In addition, in order to prevent a high cylindrical structure from collapsing, a structure where a top portion of a cylinder is supported has become common. These structures have a problem that when a metal film (e.g., a TiN film) which is a bottom electrode is formed and then a high-k film or the like is further formed as a capacitive film, a surface of the metal film is strongly oxidized by an oxidant such as ozone or $H_2O$ which is used to form the capacitive film.

SUMMARY

Due to the above-described problem, in recent years, a technique has been used in which a barrier layer is formed by oxidizing a surface of a metal film by heat, ozone, etc., in advance of the formation of a capacitive film. However, this oxidizing has the following problems: oxidizability is too strong, oxidation cannot be performed with excellent step coverage, microloading occurs, etc.

An object is therefore to provide a technique in which an oxide layer whose thickness and resistivity (sheet resistance) are arbitrarily controlled is formed with excellent uniformity in a process of oxidizing a metal film, to suppress oxidation of a surface of the metal film upon formation of a capacitive film, etc., which is a subsequent process.

According to one aspect, a technique is provided which includes:

preparing a substrate having a metal film formed on a surface thereof;

forming an oxide layer by oxidizing a surface of the metal film by plasma of a mixed gas of an oxygen-containing gas and a hydrogen-containing gas; and forming a thin film on the oxide layer by supplying an oxidizing gas to the substrate.

A technique is provided in which an oxide layer whose thickness and resistivity (sheet resistance) are arbitrarily controlled is formed with excellent uniformity in a process of oxidizing a metal film, to suppress oxidation of a surface of the metal film upon formation of a capacitive film, etc., which is a subsequent process.

Figure 1:
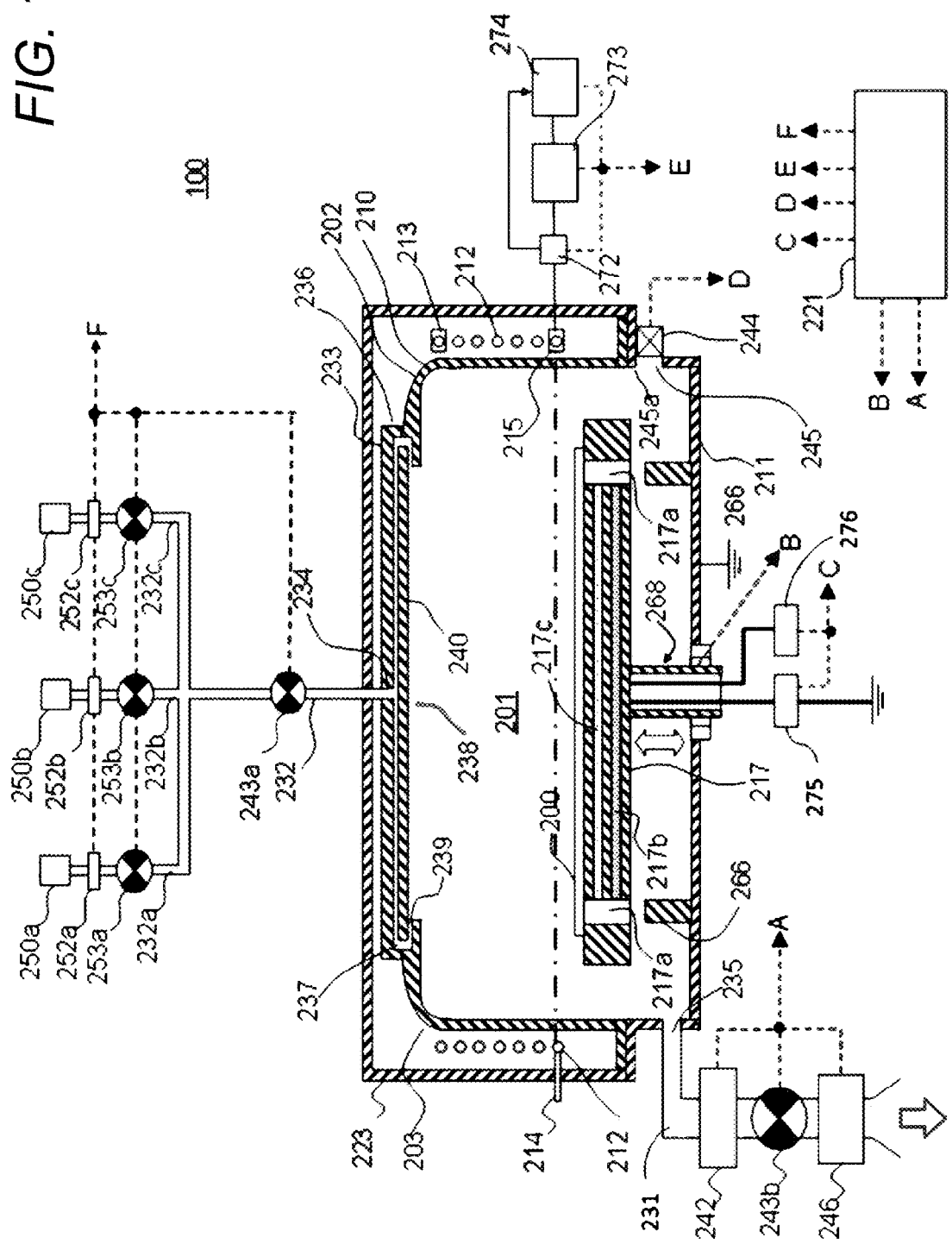
FIG. 1 is a cross-sectional view of a substrate processing apparatus according to embodiments.

DETAILED DESCRIPTION (1) Configuration of a Substrate Processing Apparatus

A substrate processing apparatus according to a first embodiment will be described below using FIGS. 1 to 6.

(Processing Chamber)

A processing apparatus 100 includes a processing furnace 202 where a wafer 200 is subjected to plasma processing. The processing furnace 202 is provided with a processing container 203 that forms a processing chamber 201. The processing container 203 includes a dome-shaped top container 210 which is a first container; and a dish-shaped bottom container 211 which is a second container. By the top container 210 placed over the bottom container 211, the processing chamber 201 is formed. The top container 210 is formed of, for example, a non-metallic material such as aluminum oxide ($Al_2O_3$) or quartz ($SiO_2$), and the bottom container 211 is formed of, for example, aluminum (Al).

In addition, the bottom container 211 has a gate valve 244 provided at a lower sidewall thereof. When the gate valve 244 is opened, the wafer 200 can be loaded into the processing chamber 201 through a loading opening 245, using a carrying mechanism (not shown). Alternatively, the gate valve 244 is configured such that the wafer 200 can be unloaded outside the processing chamber 201 through the loading opening 245, using the carrying mechanism (not shown). The gate valve 244 is configured to serve as a gate valve that maintains airtightness in the processing chamber 201 when closed.

The processing chamber 201 has, as described later, a plasma generation space 201a having a coil 212 provided therearound; and a substrate processing space 201b which communicates with the plasma generation space 201a and where the wafer 200 is processed. The plasma generation space 201a refers to a space where plasma is generated and which is above a lower end of the coil 212 (dash-dotted line) in the processing chamber 201. On the other hand, the substrate processing space 201b refers to a space where a substrate is processed by plasma and which is below the lower end of the coil 212.

(Susceptor)

A susceptor 217 serving as a substrate placement unit where the wafer 200 is placed is disposed at the center on the bottom side of the processing chamber 201. The susceptor 217 is formed of, for example, a non-metallic material such as aluminum nitride (AlN), ceramics, or quartz, and is configured to be able to reduce metal contamination on a film, etc., formed on the wafer 200.

A heater 217b serving as a heating mechanism is integrally embedded in the susceptor 217. The heater 217b is configured to be able to heat a surface of the wafer 200 to, for example, about 25° C. to 700° C. when power is supplied thereto.

The susceptor 217 is electrically insulated from the bottom container 211. An impedance adjustment electrode 217c is provided in the susceptor 217. The impedance adjustment electrode 217c is grounded through an impedance varying mechanism 275 serving as an impedance adjustment unit. The impedance varying mechanism 275 is composed of a coil and a variable capacitor, and is configured to be able to change impedance in a range of about 0Ω to the parasitic impedance value of the processing chamber 201 by controlling the inductance and resistance of the coil and the capacitance value of the variable capacitor. By this, the potential (bias voltage) of the wafer 200 can be controlled through the impedance adjustment electrode 217c and the susceptor 217.

The susceptor 217 is provided with a susceptor raising/lowering mechanism 268 that raises and lowers the susceptor 217. The susceptor 217 is provided with through-holes 217a. On the other hand, the bottom container 211 has wafer raising pins 266 provided on a bottom surface thereof. The through-holes 217a and the wafer raising pins 266 are provided at least three locations where the through-holes 217a and the wafer raising pins 266 face each other. It is configured such that, when the susceptor 217 is lowered by the susceptor raising/lowering mechanism 268, the wafer raising pins 266 go through the through-holes 217a with the wafer raising pins 266 being not in contact with the susceptor 217.

The substrate placement unit according to the present embodiment is mainly configured by the susceptor 217, the heater 217b, and the impedance adjustment electrode 217c.

(Gas Supply Unit)

A gas introduction unit 236 is provided above the processing chamber 201, i.e., at the top of the top container 210. The gas introduction unit 236 includes a cap-like cover 233, a gas introduction opening 234, a buffer chamber 237, an opening 238, a shielding plate 240, and a gas outlet 239, and is configured to be able to supply reactive gases into the processing chamber 201. The buffer chamber 237 functions as a distribution space where the reactive gases introduced through the gas introduction opening 234 are distributed.

To the gas introduction opening 234 are connected a downstream end of an oxygen-containing gas supply pipe 232a that supplies an oxygen ($O_2$) gas serving as an oxygen-containing gas, a downstream end of a hydrogen-containing gas supply pipe 232b that supplies a hydrogen ($H_2$) gas serving as a hydrogen-containing gas, and a downstream end of an inert gas supply pipe 232c that supplies a nitrogen ($N_2$) gas serving as an inert gas such that the pipes join together. The oxygen-containing gas supply pipe 232a is provided with an $O_2$ gas supply source 250a, a mass flow controller (MFC) 252a serving as a flow rate controller, and a valve 253a serving as an on/off valve, in this order from the upstream side. The hydrogen-containing gas supply pipe 232b is provided with an $H_2$ gas supply source 250b, an MFC 252b serving as a flow rate controller, and a valve 253b serving as an on/off valve, in this order from the upstream side.

The inert gas supply pipe 232c is provided with an $N_2$ gas supply source 250c, an MFC 252c serving as a flow rate controller, and a valve 253c serving as an on/off valve, in this order from the upstream side. A valve 243a is provided on the downstream side where the oxygen-containing gas supply pipe 232a, the hydrogen-containing gas supply pipe 232b, and the inert gas supply pipe 232c join together, and is connected to an upstream end of the gas introduction opening 234. It is configured such that by opening and closing the valves 253a, 253b, 253c, and 243a, reactive gases such as an oxygen-containing gas, a hydrogen-gas containing gas, and an inert gas can be supplied into the processing chamber 201 through the gas supply pipes 232a, 232b, and 232c while the flow rates of the gases are adjusted by the MFCs 252a, 252b, and 252c.

A gas supply unit according to the present embodiment is mainly configured by the gas introduction unit 236 (the cover 233, the gas introduction opening 234, the buffer chamber 237, the opening 238, the shielding plate 240, and the gas outlet 239), the oxygen-containing gas supply pipe 232a, the hydrogen-containing gas supply pipe 232b, the inert gas supply pipe 232c, the MFCs 252a, 252b, and 252c, and the valves 253a, 253b, 253c, and 243a.

In addition, an oxygen-containing gas supply system according to the present embodiment is configured by the gas introduction unit 236, the oxygen-containing gas supply pipe 232a, the MFC 252a, and the valves 253a and 243a.

Furthermore, a hydrogen-containing gas supply system according to the present embodiment is configured by the gas introduction unit 236, the hydrogen-containing gas supply pipe 232b, the MFC 252b, and the valves 253b and 243a.

Furthermore, an inert gas supply system according to the present embodiment is configured by the gas introduction unit 236, the inert gas supply pipe 232c, the MFC 252c, and the valves 253c and 243a.

Note that the gas supply unit may include the $O_2$ gas supply source 250a, the $H_2$ gas supply source 250b, and the $N_2$ gas supply source 250c. Note also that the oxygen-containing gas supply system may include the $O_2$ gas supply source 250a. Note also that the hydrogen-containing gas supply system may include the $H_2$ gas supply source 250b. Note also that the inert gas supply system may include the $N_2$ gas supply source 250c.

(Exhaust Unit)

A gas exhaust opening 235 through which reactive gases are exhausted from the processing chamber 201 is provided in the side wall of the bottom container 211. An upstream end of a gas exhaust pipe 231 is connected to the gas exhaust opening 235. The gas exhaust pipe 231 is provided with an APC (Auto Pressure Controller) valve 242 serving as a pressure regulator (pressure regulation unit), a valve 243b serving as an on/off valve, and a vacuum pump 246 serving as a vacuum-exhaust apparatus, in this order from the upstream side.

An exhaust unit according to the present embodiment is mainly configured by the gas exhaust opening 235, the gas exhaust pipe 231, the APC valve 242, and the valve 243b. Note that the exhaust unit may include the vacuum pump 246.

(Plasma Generation Unit)

A spiral resonant coil 212 serving as a first electrode is provided on an outer portion of the processing chamber 201, i.e., outside the side wall of the top container 210, so as to enclose the processing chamber 201. An RF sensor 272, a high-frequency power supply 273, and a frequency matching box 274 are connected to the resonant coil 212.

The high-frequency power supply 273 is to supply high-frequency power to the resonant coil 212. The RF sensor 272 is provided on the output side of the high-frequency power supply 273. The RF sensor 272 is to monitor information on a high-frequency traveling wave or reflected wave supplied thereto. The frequency matching box 274 is to control the high-frequency power supply 273 based on the information on a reflected wave monitored by the RF sensor 272, so as to minimize the reflected wave.

The winding diameter, winding pitch, and number of windings of the resonant coil 212 are set such that the resonant coil 212 resonates in a constant wavelength mode so as to form a standing wave with a predetermined wavelength. Namely, the electrical length of the resonant coil 212 is set to a length corresponding to an integral multiple (1×, 2×, . . . ) of one wavelength of a predetermined frequency of power supplied from the high-frequency power supply 273. For example, in the case of 13.56 MHz, the length of one wavelength is about 22 meters, in the case of 27.12 MHz, the length of one wavelength is about 11 meters, and in the case of 54.24 MHz, the length of one wavelength is about 5.5 meters. The resonant coil 212 is supported by a plurality of supports which are formed of an insulating material in a plate-like manner and which are installed vertically on an upper end surface of a base plate.

Both ends of the resonant coil 212 are electrically grounded, and at least one end of the resonant coil 212 is grounded through a movable tap 213 so as to make a fine adjustment to the electrical length of the resonant coil 212 when the apparatus is installed for the first time or when processing conditions are changed. Reference sign 214 in FIG. 1 indicates the other fixed ground. Furthermore, in order to make a fine adjustment to the impedance of the resonant coil 212 when the apparatus is installed for the first time or when processing conditions are changed, a feeding portion is configured by a movable tap 215 between both of the grounded ends of the resonant coil 212.

Namely, the resonant coil 212 includes electrically grounded ground portions at both ends thereof and includes, between the ground portions, the feeding portion to which power is supplied from the high-frequency power supply 273. Moreover, at least one ground portion serves as a position-adjustable, variable ground portion, and the feeding portion serves as a position-adjustable, variable feeding portion. When the resonant coil 212 includes the variable ground portion and the variable feeding portion, as described later, the resonant frequency and load impedance of the processing chamber 201 can be more easily adjusted. A plasma generation principle will be described later.

A shielding sheet 223 is provided to shield leakage of an electromagnetic wave of the resonant coil 212 to the outside, and to form a capacitive component required to form a resonant circuit between the resonant coil 212 and the shielding sheet 223. The shielding sheet 223 is generally formed cylindrically, using a conductive material such as an aluminum alloy, copper, or a copper alloy. The shielding sheet 223 is disposed so as to be spaced, for example, about 5 to 150 mm from the outer portion of the resonant coil 212.

The RF sensor 272 is installed on the output side of the high-frequency power supply 273, and monitors a traveling wave, a reflected wave, etc. Reflected-wave power monitored by the RF sensor 272 is inputted to the frequency matching box 274. The frequency matching box 274 controls frequency so as to minimize the reflected wave.

A plasma generation unit according to the present embodiment is mainly configured by the resonant coil 212, the RF sensor 272, and the frequency matching box 274. Note that the plasma generation unit may include the high-frequency power supply 273. In this manner, the plasma generation unit capable of generating inductively coupled plasma (ICP) is formed.

Figure 2:
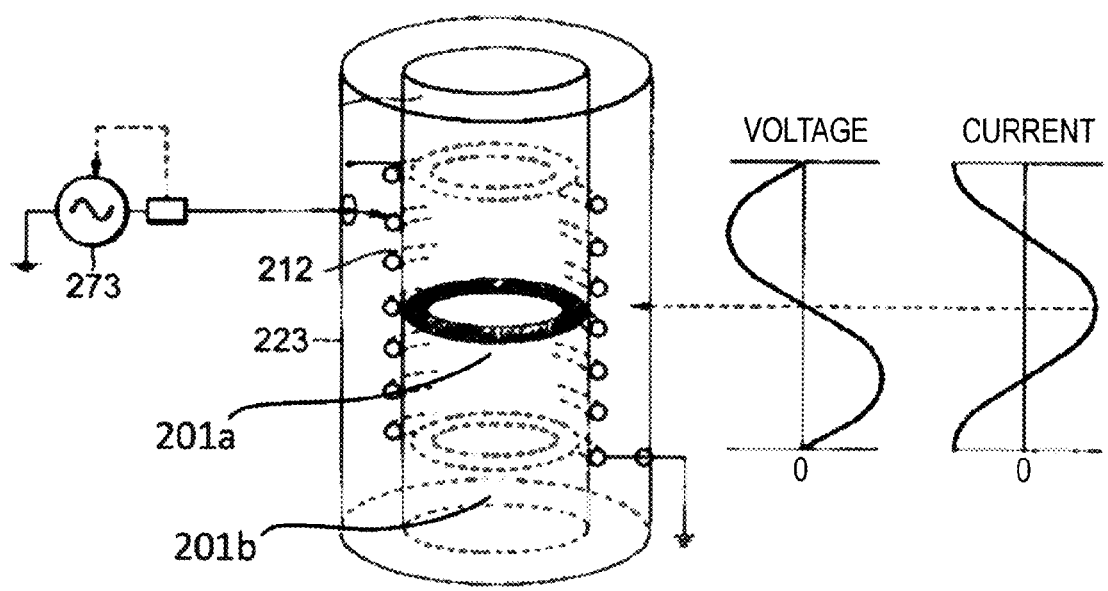
FIG. 2 is an illustrative diagram describing a plasma generation principle of the substrate processing apparatus according to embodiments.

Now, the plasma generation principle of the apparatus according to the present embodiment and the properties of plasma to be generated will be described using FIG. 2.

The winding diameter, winding pitch, and number of windings of the resonant coil 212 are set such that the resonant coil 212 resonates in a full-wavelength mode so as to form a standing wave with a predetermined wavelength. Namely, the electrical length of the resonant coil 212 is set to an integral multiple (1×, 2×, . . . ) of one wavelength of a predetermined frequency of power provided by the high-frequency power supply 273.

Specifically, taking into account the power to be applied, the magnetic field strength to be generated, the outside shape of an apparatus to be applied, or the like, the resonant coil 212 is set, for example, to have an effective cross-sectional area of 50 mm$^2$ to 300 mm$^2$, a coil diameter of 200 mm to 500 mm, and about 2 to 60 windings on the outer portion side of a room forming the plasma generation space 201a, so that the resonant coil 212 can generate a magnetic field of about 0.01 gauss to 10 gauss by a high-frequency power of 800 kHz to 50 MHz and 0.5 KW to 5 KW. Note that for a material forming the resonant coil 212, a copper pipe, a copper sheet, an aluminum pipe, an aluminum sheet, a material having copper or aluminum deposited on a polymer belt, or the like, is used.

In addition, one or both ends of the resonant coil 212 are normally grounded through a movable tap so that a fine adjustment can be made to the electrical length of the resonant coil 212 upon installment to make the resonance characteristic of the resonant coil 212 substantially equal to that of the high-frequency power supply 273. Furthermore, a wavelength adjustment circuit composed of a coil and a shield is inserted in one end (or the other end or both ends) of the resonant coil 212 so that in-phase and anti-phase currents flow symmetrically with respect to an electrical midpoint of the resonant coil 212. The wavelength adjustment circuit forms an open circuit by setting an end portion of the resonant coil 212 to an electrically non-connected state or an electrically equivalent state. In addition, the end portion of the resonant coil 212 may be ungrounded by a resistor in series with a choke and direct-current connected to a fixed reference potential.

The shielding sheet 223 is provided to shield an electric field generated outside the resonant coil 212 and to form a capacitive component (C component) required to form a resonant circuit between the resonant coil 212 and the shielding sheet 223. The shielding sheet 223 is generally formed cylindrically, using a conductive material such as an aluminum alloy, copper, or a copper alloy. The shielding sheet 223 is disposed so as to be spaced about 5 to 150 mm from the outer portion of the resonant coil 212. Normally, the shielding sheet 223 is grounded so as to have a potential equal to that of both ends of the resonant coil 212. In order to accurately set the number of resonances of the resonant coil 212, the tap position of one or both ends of the shielding sheet 223 is adjustable. Alternatively, in order to accurately set the number of resonances, a trimming capacitance may be inserted between the resonant coil 212 and the shielding sheet 223.

The high-frequency power supply 273 includes power supply control means (control circuit) including a high-frequency oscillation circuit for defining an oscillation frequency and an output, and a preamplifier; and an amplifier (output circuit) for amplifying to a predetermined output. The power supply control means controls the amplifier based on output conditions for frequency and power which are preset through an operating panel, and the amplifier supplies constant high-frequency power to the resonant coil 212 through a transmission line.

Meanwhile, a plasma generation circuit configured by the resonant coil 212 is composed of a parallel resonant RLC circuit. When the wavelength of the high-frequency power supply 273 is the same as the electrical length of the resonant coil 212, the resonance condition of the resonant coil 212 is that the reactance components produced by the capacitive component and inductive component of the resonant coil 212 cancel each other out and accordingly the resonant coil 212 becomes purely resistive. However, in the above-described plasma generation circuit, when plasma is generated, an actual resonant frequency slightly fluctuates by a fluctuation in capacitive coupling between a voltage portion of the resonant coil 212 and the plasma or in inductive coupling between the plasma generation space 201a and the plasma or by a plasma excited state.

Hence, in the present embodiment, in order for the power supply side to compensate for a shift in the resonance of the resonant coil 212 occurring upon generation of plasma, the frequency matching box 274 has the function of detecting reflected-wave power from the resonant coil 212 upon generation of plasma, to complement an output. By such a configuration, in a resonator of the present embodiment, the resonant coil 212 can form a standing wave more accurately and can generate plasma with very little capacitive coupling.

Namely, the frequency matching box 274 detects reflected-wave power from the resonant coil 212 generated upon generation of plasma, and increases or decreases the above-described predetermined frequency so as to minimize the reflected-wave power. Specifically, in the frequency matching box 274, a frequency control circuit that corrects a preset oscillation frequency is formed, and a reflected-wave power meter that serves as a part of the frequency matching box 274 and that detects reflected-wave power in the transmission line and feeds back a voltage signal corresponding to the detected reflected-wave power to the frequency control circuit is interposed on the output side of the amplifier.

The frequency control circuit is configured by an A/D converter that accepts as input a voltage signal from the reflected-wave power meter and digital-converts the voltage signal into a frequency signal; an arithmetic processing circuit that performs an addition/subtraction process on the value of the converted frequency signal corresponding to a reflected wave and the value of an oscillation frequency set and stored in advance; a D/A converter that analog-converts the value of a frequency obtained by performing the addition/subtraction process into a voltage signal; and a voltage control oscillator that oscillates according to an applied voltage from the D/A converter. Therefore, before plasma is turned on, the frequency control circuit oscillates at a no-load resonant frequency of the resonant coil 212, and after plasma is turned on, the frequency control circuit oscillates at a frequency that is obtained by increasing or decreasing the above-described predetermined frequency to minimize reflected-wave power, and eventually provides a frequency signal to the amplifier such that a reflected wave in the transmission line becomes zero.

In the present embodiment, after depressurizing the inside of the plasma generation space 201a, a plasma gas (in the present embodiment, a mixed gas of $O_2$ and $H_2$) is supplied to the plasma generation space 201a while the above-described degree of vacuum is maintained. Then, when a high-frequency power of, for example, 27.12 MHz and 1.5 to 3.5 KW is supplied to the resonant coil 212 from the high-frequency power supply 273, an induced electric field is generated in the plasma generation space 201a, and as a result, the supplied gas goes into a plasma state in the plasma generation space 201a.

The frequency matching box 274 placed along the high-frequency power supply 273 compensates for a shift in the resonance point of the resonant coil 212 caused by a fluctuation in capacitive coupling or inductive coupling of the generated plasma, on the high-frequency power supply 273 side. Namely, the RF sensor 272 for the frequency matching box 274 detects reflected-wave power generated by a fluctuation in capacitive coupling or inductive coupling of plasma, and increases or decreases the above-described predetermined frequency by an amount corresponding to a shift in resonant frequency which is the cause of generation of the reflected-wave power, so as to minimize the reflected-wave power, and allows the amplifier to output a high resonant frequency of the resonant coil 212 under plasma conditions.

In other words, in the resonator of the present embodiment, since a high frequency at which resonance occurs properly is outputted according to a shift in the resonance point of the resonant coil 212 occurring upon generation of plasma and upon a change in plasma generation conditions, the resonant coil 212 can form a standing wave more accurately. Namely, as shown in FIG. 2, the resonant coil 212 forms a standing wave where an in-phase voltage and an anti-phase voltage always cancel each other out, by transmission of electric power at an actual resonant frequency of the resonator containing plasma, and the highest phase current is generated at an electrical midpoint (a node with zero voltage) of the resonant coil 212. Therefore, induced plasma excited at the electrical midpoint has almost no capacitive coupling with a processing chamber wall or a substrate placement table, and accordingly, doughnut-like plasma with a very low electrical potential can be formed in the plasma generation space 201a.

(Control Unit)

Figure 3:
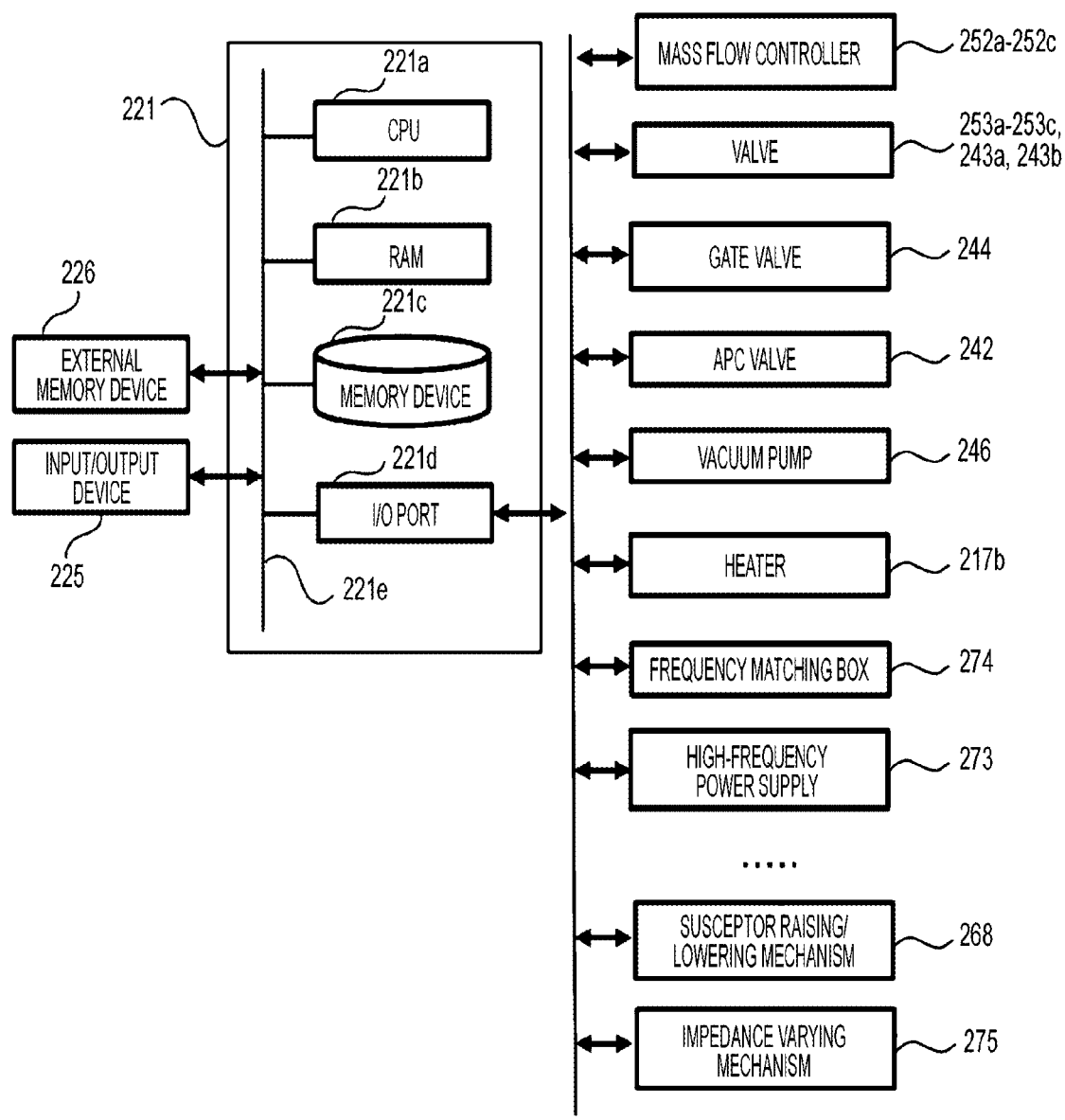
FIG. 3 is a diagram describing a controller according to the embodiments.

As shown in FIG. 3, a controller 221 serving as a control unit is configured as a computer including a CPU (Central Processing Unit) 221a, a RAM (Random Access Memory) 221b, a memory device 221c, and an I/O port 221d. The RAM 221b, the memory device 221c, and the I/O port 221d are configured to be able to exchange data with the CPU 221a through an internal bus 221e. The controller 221 may have, for example, a touch panel, a mouse, a keyboard, an operating terminal, etc., connected thereto as an input/output device 225. In addition, the controller 221 may have, for example, a display, etc., connected thereto as a display unit.

The memory device 221c is configured by, for example, a flash memory, an HDD (Hard Disk Drive), etc. The memory device 221c stores therein a control program for controlling the operation of the processing apparatus 100, process recipes that describe the procedure, conditions, etc., of substrate processing, etc., in a readable manner. Note that the process recipes are recipes combined together to cause the controller 221 to perform the steps of a substrate processing process (described later) so that a predetermined result can be obtained, and function as a program. The process recipes, control program, etc., are hereinafter also collectively simply referred to as a program. Note also that the process recipes are also simply referred to as recipes. When the term "program" is used in this specification, it refers to a case of including only the recipes alone, a case of including only the control program alone, or a case of including both. In addition, the RAM 221b is configured as a memory area (work area) that temporarily holds a program, data, etc., read by the CPU 221a.

The I/O port 221d is connected to the above-described MFCs 252a to 252c, valves 253a to 253c, 243a, and 243b, gate valve 244, APC valve 242, vacuum pump 246, heater 217b, RF sensor 272, high-frequency power supply 273, frequency matching box 274, susceptor raising/lowering mechanism 268, impedance varying mechanism 275, etc.

The CPU 221a is configured to read and execute the control program from the memory device 221c and to read the recipes from the memory device 221c according to, for example, an input of an operation command from the input/output device 225. The CPU 221a is configured to control the operation of adjusting the degree of opening of the APC valve 242, the operation of opening and closing the valve 243b, and the start and stop of the vacuum pump 246 through the I/O port 221d and a signal line A; the operation of raising and lowering the susceptor raising/lowering mechanism 268 through a signal line B; the operation of adjusting the amount of power supplied to the heater 217b (temperature adjustment operation) based on a temperature sensor by a heater power adjustment mechanism 276 and the operation of adjusting an impedance value by the impedance varying mechanism 275 through a signal line C; the operation of opening and closing the gate valve 244 through a signal line D; the operation of the RF sensor 272, the frequency matching box 274, and the high-frequency power supply 273 through a signal line E; and the operation of adjusting the flow rates of various types of gas by the MFCs 252a to 252c and the operation of opening and closing the valves 253a to 253c and 243a through a signal line F, so as to follow the content of the read recipes.

The controller 221 can be configured by installing, on a computer, the above-described program stored in an external memory device (e.g., a magnetic disk such as a magnetic tape, a flexible disk, or a hard disk, an optical disk such as a CD or a DVD, a magneto-optical disk such as an MO, or a semiconductor memory such as a USB memory or a memory card) 226. The memory device 221c and the external memory device 226 are configured as non-transitory computer-readable recording media. The memory device 221c and the external memory device 226 may also be hereinafter collectively simply referred to as a recording medium. Note that when the term "recording medium" is used in this specification, it refers to a case of including only the memory device 221c alone, a case of including only the external memory device 226 alone, or a case of including both. Note that provision of the program to the computer may be performed using communication means such as the Internet or a dedicated line, instead of using the external memory device 226.

(2) Substrate Processing Process

Figure 5:
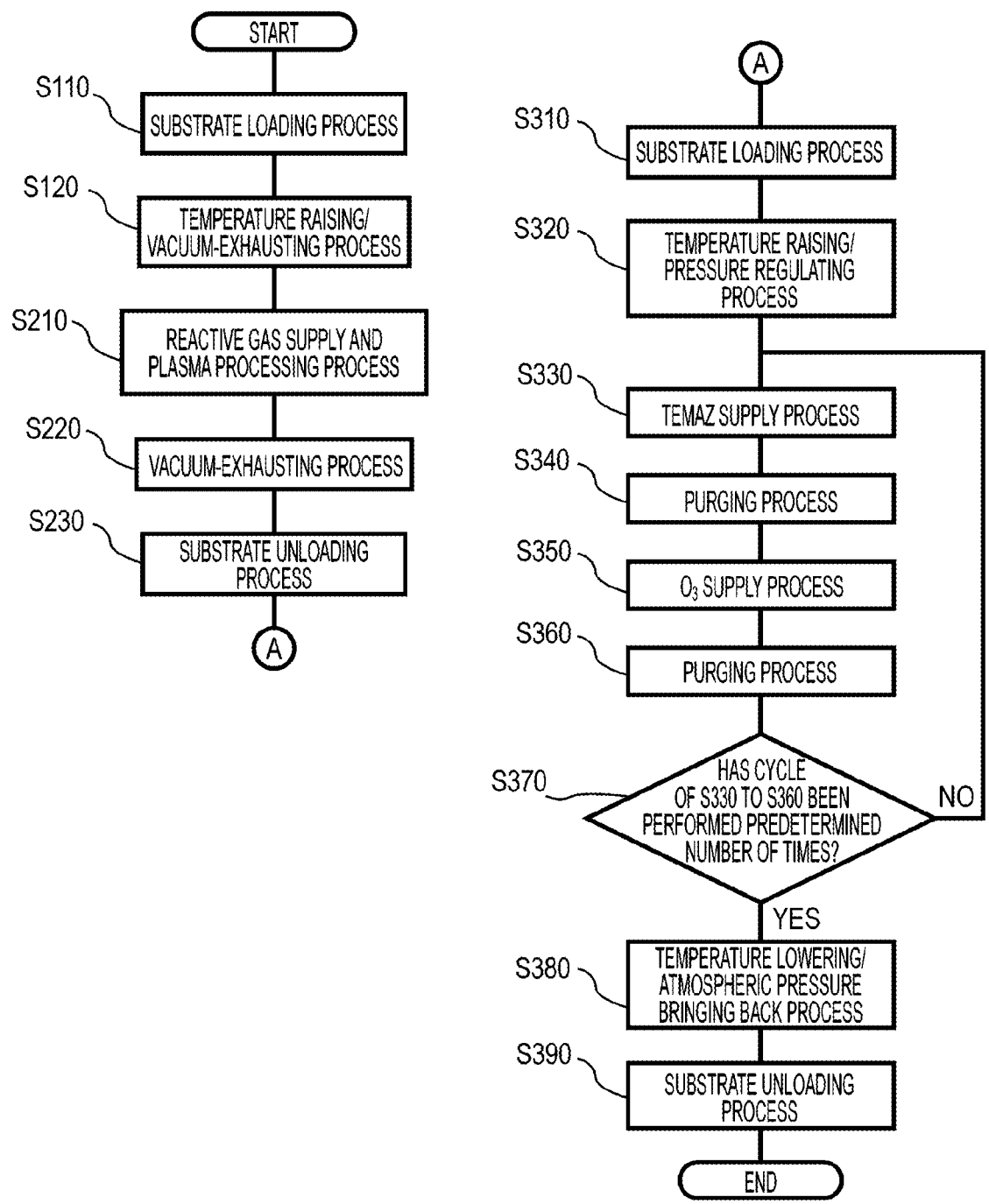
FIG. 5 is a flowchart showing a substrate processing process according to a first embodiment.

Next, a substrate processing process according to the present embodiment will be described mainly using FIG. 5. FIG. 5 is a flowchart showing a substrate processing process according to the present embodiment. The substrate processing process according to the present embodiment is performed, for example, as one of the processes of manufacturing a semiconductor device such as a memory capacitor element.

The present teachings are applicable not only to a planar shape, but also to a structure such as a capacitor element whose electrode has a three-dimensional structure. Capacitor elements having a three-dimensional structure will be described with reference to FIGS. 4A and 4B.

Figure 4A:
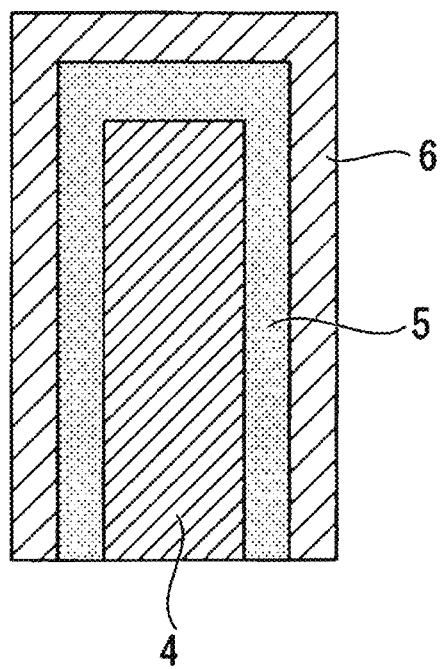
FIG. 4A is a vertical cross-sectional view of a column-shaped (pillar-shaped) capacitor element.

FIG. 4A is a vertical cross-sectional view of a column-shaped (pillar-shaped) capacitor element. Reference sign 4 indicates a bottom electrode formed in a columnar shape, using a high-melting metal such as titanium nitride (TiN). Reference sign 5 indicates a capacitive insulating film (mainly, a high-k film) for a capacitor element, which is formed so as to cover the top surface and side surface portions of the bottom electrode 4. Atop electrode 6 is formed using a high-melting metal such as TiN so as to cover the capacitive insulating film 5. For materials of these electrodes, materials other than TiN can also be used.

Figure 4B:
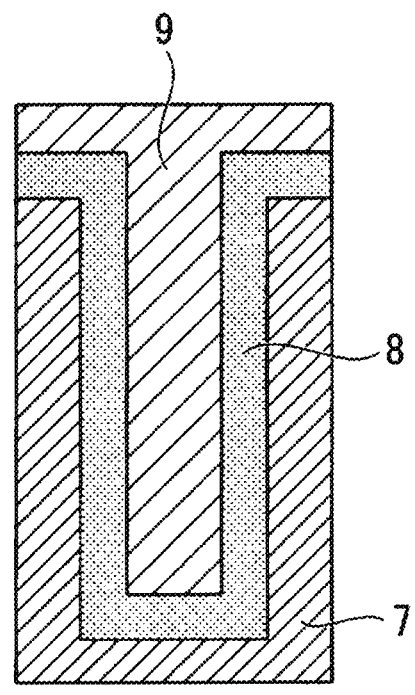
FIG. 4B is a vertical cross-sectional view of a cylindrical-shaped capacitor element.

FIG. 4B is a vertical cross-sectional view of a cylindrical-shaped capacitor element. Reference sign 7 indicates a bottom electrode (TiN, etc.) formed in a hollow cylindrical shape, using a high-melting metal such as TiN. Reference sign 8 indicates a capacitive insulating film (mainly, a high-k film) for a capacitor element, which is formed so as to cover the inner wall and top surface portions of the bottom electrode 7. Reference sign 9 indicates a top electrode formed using a high-melting metal such as TiN so as to cover the capacitive insulating film 8.

As shown in FIG. 4A or 4B, by allowing a top electrode and a bottom electrode to have a three-dimensional structure, a high-capacitance capacitor element can be formed with the same occupied area.

Note that for the structure of a device such as a capacitor element, various structures can be employed in addition to those described above, but in this specification, structures such as those columnar and cylindrical shapes may be collectively referred to as a "film". The above-described metal constituent formed in a columnar or cylindrical shape is hereinafter also collectively referred to as a metal film.

Note also that the term "metal film" refers to a film composed of a conductive substance containing a metal atom, and the film includes a conductive metal nitride film, a conductive metal oxide film, a conductive metal oxynitride film, a conductive metal composite film, a conductive metal alloy film, a conductive metal silicide film, etc., in addition to a conductive elemental metal film composed of an elemental metal. For example, a TiN film is a conductive metal nitride film.

<<Barrier Layer Formation Process>>

In the following barrier layer formation process (S110 to S230) according to the present embodiment, an oxide layer (oxide film) serving as a barrier layer (barrier film) is formed on the above-described bottom electrode 4 which is formed on a wafer 200. The barrier layer formation process is performed by the processing apparatus 100. Note that in the following description the operation of the units composing the processing apparatus 100 is controlled by the controller 221.

(Substrate Loading Process (Substrate Preparation Process) S110)

First, a wafer 200 having a TiN film, which serves as a bottom electrode 4, formed on a surface thereof is loaded (prepared) into the processing chamber 201. Specifically, the susceptor raising/lowering mechanism 268 lowers the susceptor 217 to a carrying position of the wafer 200 to allow the wafer raising pins 266 to pass through the through-holes 217a of the susceptor 217. As a result, the wafer raising pins 266 protrude from a surface of the susceptor 217 by an amount corresponding to a predetermined height.

Subsequently, the gate valve 244 is opened and the wafer 200 is loaded into the processing chamber 201 from a vacuum carrying chamber (not shown) adjacent to the processing chamber 201, using a carrying mechanism (not shown). As a result, the wafer 200 is supported in a horizontal posture on the wafer raising pins 266 protruding from the surface of the susceptor 217. When the wafer 200 is loaded into the processing chamber 201, the transport mechanism is allowed to come out of the processing chamber 201, and the gate valve 244 is closed to hermetically seal the processing chamber 201. Then, the susceptor raising/lowering mechanism 268 raises the susceptor 217 to a predetermined position between the lower end of the resonant coil 212 and an upper end 245a of the loading opening 245. As a result, the wafer 200 is supported on a top surface of the susceptor 217. Note that the substrate loading process S110 may be performed while the inside of the processing chamber 201 is purged with an inert gas, etc.

(Temperature Raising/Vacuum-Exhausting Process S120)

Subsequently, the temperature of the wafer 200 loaded (prepared) into the processing chamber 201 is raised. The heater 217b is pre-heated. By allowing the loaded wafer 200 to be retained on the susceptor 217 having the heater 217b embedded therein, the wafer 200 is heated to a predetermined value in a range of, for example, room temperature (25° C.) or more to 680° C. or less. Note that to suppress thermal damage to a device pattern formed on the wafer 200, it is desirable that the processing temperature of the wafer 200 be a temperature that is high enough to be able to stably generate plasma and that is as low as possible. The processing temperature is preferably room temperature or more and 300° C. or less, and more preferably room temperature or more and 150° C. or less. In the present embodiment, since substrate processing is performed using plasma generated by the above-described plasma generation means, even in a low-temperature range, desired substrate processing can be performed. Here, in the present embodiment, the wafer 200 is heated to a temperature of 100° C. In addition, while the temperature of the wafer 200 is raised, the inside of the processing chamber 201 is vacuum-exhausted by the vacuum pump 246 through the gas exhaust pipe 231 such that the pressure in the processing chamber 201 has a predetermined value in a range of 0.1 Pa or more to 1000 Pa or less. Here, in the present embodiment, the pressure is regulated to 200 Pa. The vacuum pump 246 is allowed to operate at least until a substrate unloading process S230 (described later) ends.

(Reactive Gas Supply and Plasma Processing Process S210)

Next, a supply of an $O_2$ gas and an $H_2$ gas which serve as reactive gases starts. Specifically, as follows.

(Mixed-Gas Flow Rate Control Process)

By opening the valves 243a, 253a, and 253b, a mixed gas of an $O_2$ gas and an $H_2$ gas is introduced (supplied) into the processing chamber 201 through the buffer chamber 237. The MFCs 252a and 252b are controlled such that the mixture ratio of an $O_2$ gas to an $H_2$ gas in the mixed gas of an $O_2$ gas and an $H_2$ gas reaches a predetermined ratio where the $H_2$ gas is in a range of 2% or more to 10% or less (i.e., the $O_2$ gas is in a range of 90% or more to 98% or less). In the present embodiment, the mixed gas is supplied such that the $H_2$ gas is 5% and the $O_2$ gas is 95%. For example, the gas flow rates are such that the $H_2$ gas is 50 sccm and the $O_2$ gas is 950 sccm.

Before supplying the mixed gas, an $H_2$ gas may be introduced into the processing chamber 201 to regulate the inside of the processing chamber 201 to have a predetermined pressure. By doing so, upon a start of a mixed-gas supply, sudden oxidation of the bottom electrode 4 can be suppressed, with the pressure in the processing chamber 201 maintained. Note that by introducing an $N_2$ gas which is an inert gas simultaneously in addition to an $O_2$ gas and an $H_2$ gas, a mixed gas of an $O_2$ gas, an $H_2$ gas, and an $N_2$ gas may be supplied.

In addition, the degree of opening of the APC valve 242 is adjusted such that the pressure in the processing chamber 201 after supplying the mixed gas reaches a predetermined pressure, e.g., 15 Pa or more and 250 Pa or less (in the present embodiment, 120 Pa).

(Plasma Generation Start Process)

After a lapse of a predetermined period of time (e.g., after a lapse of several seconds) from the start of introduction of the mixed gas, application of high-frequency power to the resonant coil 212 from the high-frequency power supply 273 through the RF sensor 272 starts. In the present embodiment, for example, a high-frequency power of 27.12 MHz and 1.5 KW is supplied to the resonant coil 212 from the high-frequency power supply 273. By this, a high-frequency electric field is formed in the plasma generation space 201a, and by the electric field, doughnut-like induced plasma is excited in a height position corresponding to an electrical midpoint of the resonant coil 212 in the plasma generation space 201a. The $O_2$ gas and $H_2$ gas in plasma form are dissociated, generating reactive species such as active hydroxyl group species containing oxygen (O) and hydrogen (H) (hydroxyl group radicals, OH*), oxygen ions, active hydrogen species (hydrogen radicals, H*), and hydrogen ions.

As described above, a standing wave where an in-phase voltage and an anti-phase voltage always cancel each other out is formed, and the highest phase current is generated at the electrical midpoint (a node with zero voltage) of the resonant coil 212. Therefore, induced plasma excited at the electrical midpoint has almost no capacitive coupling with the processing chamber wall or the substrate placement table, and accordingly, doughnut-like plasma with a very low electrical potential can be formed in the plasma generation space 201a.

Furthermore, as described above, the frequency matching box 274 placed along the high-frequency power supply 273 compensates for a shift in the resonance point of the resonant coil 212 caused by a fluctuation in capacitive coupling or inductive coupling of plasma, by which a standing wave is formed more accurately. Thus, there is almost no capacitive coupling, enabling to more securely form plasma with a very low electrical potential in the plasma generation space 201a.

Since plasma with a very low electrical potential is generated, sheath can be prevented from being generated on a wall of the plasma generation space 201a or on the substrate placement table. Therefore, ions in the plasma are not accelerated.

Radicals such as OH* and H* and non-accelerated ions are uniformly supplied into trenches formed on a surface of the wafer 200 retained on the susceptor 217 in the substrate processing space 201b. The supplied radicals and ions uniformly react with side walls of the trenches, modifying a silicon film into a silicon oxide film with high step coverage. Furthermore, since ion attack by acceleration can be prevented, wafer damage caused by ions can be suppressed.

Furthermore, since ion acceleration is prevented, there is no sputtering action on a peripheral wall of the plasma generation space 201a, and accordingly, damage to the peripheral wall of the plasma generation space 201a does not occur. As a result, the apparatus life can be improved. Moreover, a problem that the member components of the plasma generation space 201a, etc., mix in the plasma, contaminating the wafer 200 can also be prevented.

(Oxidizing Process)

Then, the reactive species such as active hydrogen species (H*), active hydroxyl group species (OH*), and other ions which are generated by the plasma excitation of the mixed gas of an $H_2$ gas and an $O_2$ gas are supplied to the TiN film formed on the surface of the wafer 200, by which plasma processing (oxidizing) is performed on the wafer 200.

Specifically, when the mixed gas of an $H_2$ gas and an $O_2$ gas are activated by plasma, for example, H* and OH* are generated. The OH* acts on a surface of the TiN film on the wafer 200, by which the surface is oxidized, forming an oxide layer. In addition, the H* has relatively low reducibility with respect to this region containing silicon.

In general, with respect to the surface of the metal film (TiN film, etc.) on the wafer 200, OH* has oxidizability and H* has reducibility. For example, when the OH* concentration is relatively high (the H* concentration is relatively low), the surface of the metal film on the wafer 200 is oxidized. That is, in this case, the oxidizing action by OH* is larger than the reducing action by H*. On the other hand, when the OH* concentration is relatively low (the H* concentration is relatively high), the surface of the metal film on the wafer 200 is not oxidized (is reduced). That is, in this case, the reducing action by H* is larger than the oxidizing action by OH*. In the present embodiment, by setting the mixture ratio of an $O_2$ gas to an $H_2$ gas supplied to a predetermined ratio where the $H_2$ gas is in a range of 2% or more to 10% or less, the surface of the metal film is oxidized by the action of OH*, forming an oxide layer serving as a barrier layer; on the other hand, excessive oxidation is suppressed by the action of H*. Specifically, it is desirable to form an oxide layer such that the amount of increase in the sheet resistance of the metal film caused by the oxidizing is in a range of more than 0% to 100% or less. By changing the mixture ratio of an $O_2$ gas to an $H_2$ gas within the above-described range, the amount of increase in sheet resistance may be changed. Here, when the $H_2$ gas is less than 2%, since the metal film is easily oxidized excessively, it becomes difficult in general to set the amount of increase in the sheet resistance of the metal film to 100% or less. In addition, when the $H_2$ gas is more than 10%, since the H* concentration increases and the metal film is easily reduced by H*, it becomes difficult in general to set the amount of increase in the sheet resistance of the metal film to more than 0%, or a practical oxidation rate cannot be obtained.

In addition, in the present embodiment, since the metal film is oxidized using reactive species which are generated by the plasma excitation of a mixed gas of an $O_2$ gas and an $H_2$ gas, an effect of fixing a defect in a metal film structure by H* occurs, and accordingly, an oxide layer with close-packed film quality can be formed compared to the case of plasma using only an $O_2$ gas.

In addition, although in the present embodiment, a high-frequency power of 1.5 KW is supplied to the resonant coil 212 from the high-frequency power supply 273, by changing the value of high-frequency power supplied to a predetermined value in a range of, for example, 1.5 KW or more to 3.5 KW or less, the amount of increase in the sheet resistance of the metal film caused by the oxidizing can be controlled in a range of more than 0% to 100% or less. It is desirable to set the value of high-frequency power supplied to a value lower than that for when oxidizing is performed on a silicon film. Note, however, that when the value of high-frequency power to be supplied is too small such as less than 1.5 KW, it is difficult in general to stably excite plasma and thus the metal film cannot be oxidized with excellent controllability. In addition, when the value of high-frequency power is more than 3.5 KW, it may become difficult to control the amount of increase in the sheet resistance of the metal film to be in a range of 100% or less.

Thereafter, when predetermined processing time, e.g., 15 seconds to 30 seconds, has elapsed, the output of power from the high-frequency power supply 273 is stopped to stop the plasma discharge in the processing chamber 201. In addition, by closing the valves 243a, 253a, and 253b, the supply of an $O_2$ gas and an $H_2$ gas into the processing chamber 201 is stopped. By the above, the plasma processing process S210 ends. Note that by changing the time for the oxidizing process to, for example, predetermined time in the above-described range, the amount of increase in the sheet resistance of the metal film caused by the oxidizing can also be controlled in a range of more than 0% to 100% or less. It is desirable to set the processing time to be shorter than that for when oxidizing is performed on a silicon film, e.g., about 15 seconds to 30 seconds. Note, however, that when the processing time is too short such as less than 15 seconds, it is difficult in general to stably excite plasma and thus the metal film cannot be oxidized with excellent controllability.

(Vacuum-Exhausting Process S220)

When the predetermined processing time has elapsed and the supply of an $O_2$ gas and an $H_2$ gas is stopped, the inside of the processing chamber 201 is vacuum-exhausted using the gas exhaust pipe 231. By this, an $O_2$ gas, an $H_2$ gas, and other exhaust gases generated by the oxidizing in the processing chamber 201 are exhausted out of the processing chamber 201. Thereafter, the pressure in the processing chamber 201 is regulated to the same pressure (e.g., 100 Pa) as that of the vacuum carrying chamber (a place to which the wafer 200 is unloaded; not shown) adjacent to the processing chamber 201, by adjusting the degree of opening of the APC valve 242.

(Substrate Unloading Process S230)

When the inside of the processing chamber 201 reaches a predetermined pressure, the susceptor 217 is lower to the carrying position of the wafer 200 to allow the wafer 200 to be supported on the wafer raising pins 266. Then, by opening the gate valve 244, the wafer 200 is unloaded out of the processing chamber 201, using the carrying mechanism (not shown). At this time, the wafer 200 may be unloaded while the inside of the processing chamber 201 is purged with an inert gas, etc. By the above, the substrate processing process according to the present embodiment ends.

<<Capacitive Insulating Film Formation Process>>

Figure 6:
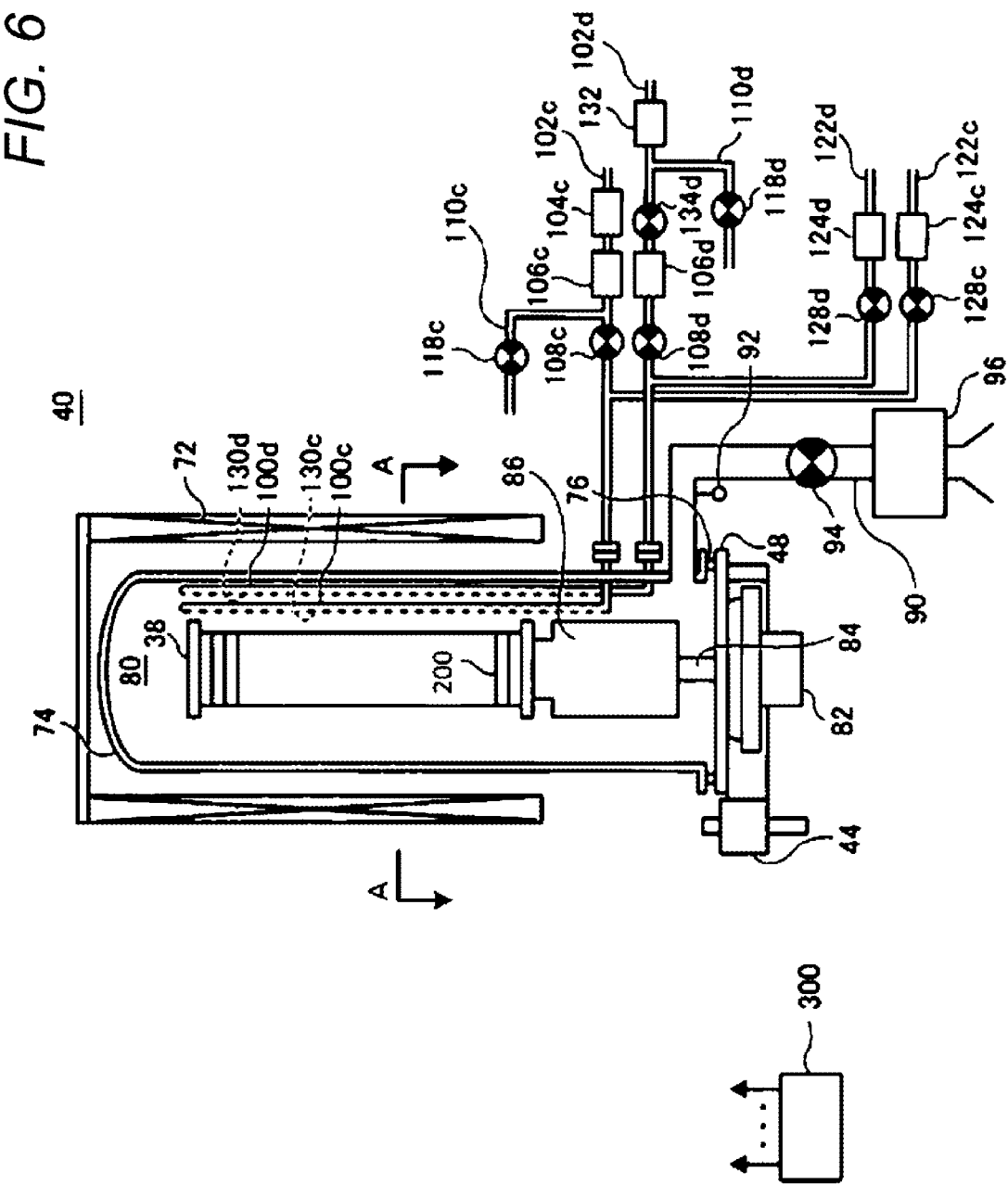
FIG. 6 is a schematic diagram of a processing furnace for a high-k film formation process of the first embodiment and structures around the processing furnace.
Figure 7:
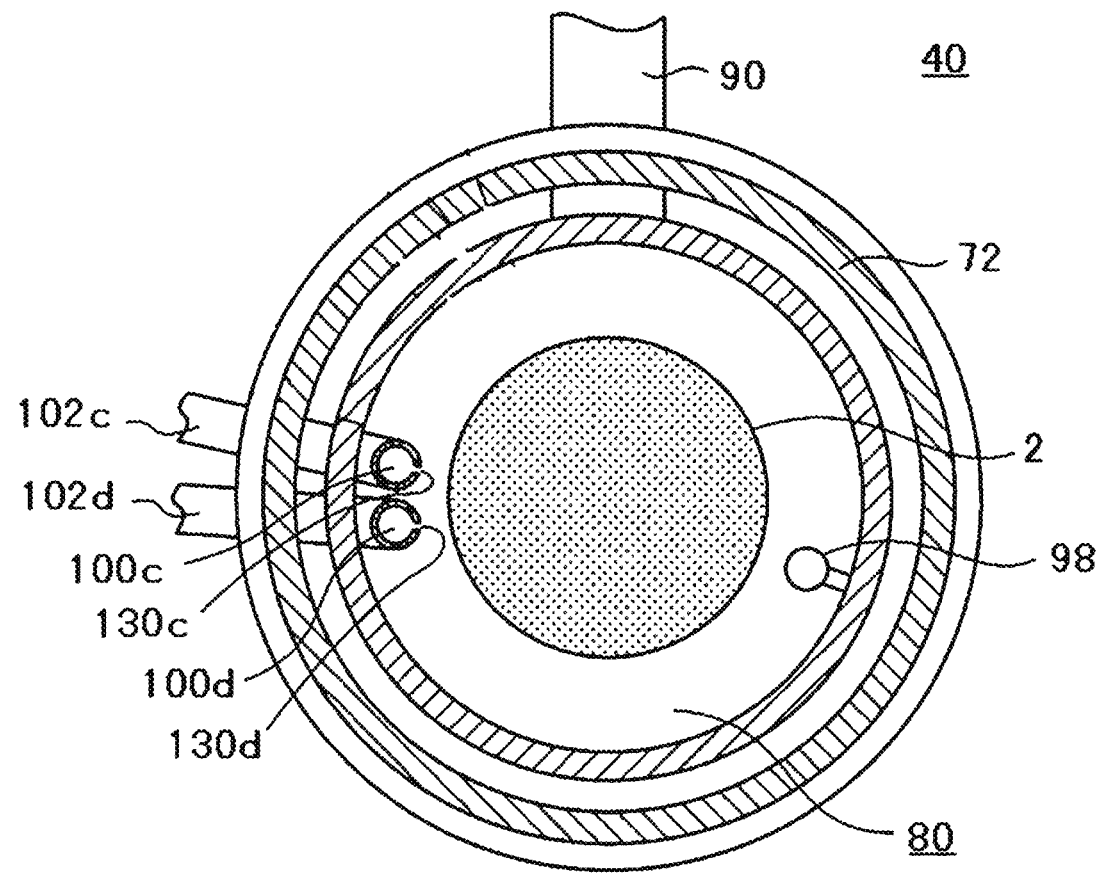
FIG. 7 is an A-A cross-sectional view of FIG. 6.

Next, a process of forming a high-k film serving as a capacitive insulating film (capacitive insulating film formation process) after forming a barrier layer by oxidizing a TiN film formed on a surface of a wafer 200 will be described using FIGS. 5, 6, and 7. The capacitive insulating film formation process is performed by a processing apparatus 40. Note that in the following description the operation of units composing the processing apparatus 40 is controlled by a controller 300.

In the present embodiment, a TEMAZ (tetrakis (ethylmethylamino) zirconium): $Zr"N(C_2H_5) CH_3"_4)$ gas which is a zirconium (Zr)-containing gas and which is an organic metal source gas is used as a source gas, and an $O_3$ gas which is an oxygen-containing gas is used as an oxidation gas. In addition, an $N_2$ gas is used as an inert gas.

(Substrate Loading Process S310)

First, a plurality of wafers 200, where a barrier layer is formed on a surface of a TiN film which is a metal film in the above-described barrier layer formation process, are charged (wafer-charged) into a boat 38 provided to the processing apparatus 40. The boat 38 supporting the plurality of wafers 200 is lifted by a boat elevator 44 and loaded (boat-loaded) into a processing chamber 80.

(Temperature Raising/Pressure Regulating Process S320)

The inside of the processing chamber 80 is vacuum-exhausted by a vacuum pump 96 so as to have a desired pressure (degree of vacuum). At this time, the pressure in the processing chamber 80 is measured by a pressure sensor 92, and an APC valve 94 is feedback-controlled based on the measured pressure (pressure regulation).

In addition, the inside of the processing chamber 80 is heated by a heater 72 to a desired temperature. At this time, in order for the inside of the processing chamber 80 to have a desired temperature distribution, how a current is carried through the heater 72 is feedback-controlled based on temperature information detected by a temperature sensor 98 (temperature adjustment).

Subsequently, by rotating the boat 38 by a rotating mechanism 82, the wafers 200 are rotated.

(TEMAZ Supply Process S330)

Next, a process of forming a zirconium oxide ($ZrO_2$) film which is a high-k film formed as a capacitive insulting film by supplying a TEMAZ gas and an $O_3$ gas into the processing chamber 80 is performed. In the process of forming an insulating film, the following four steps are sequentially performed.

First, as a second source, a TEMAZ gas is supplied to the processing chamber 80.

By opening a valve 108c of a gas supply pipe 102c and closing a valve 118c of a vent line 110c, a TEMAZ gas flows through the gas supply pipe 102c through a vaporizer 106c. The flow rate of the TEMAZ gas flowing through the gas supply pipe 102c is adjusted by an MFC 104c. The flow-rate-adjusted TEMAZ gas is exhausted through an exhaust pipe 90 while supplied into the processing chamber 80 through a gas supply hole 130c of a nozzle 100c.

At this time, by opening a valve 128c, an $N_2$ gas is allowed to flow through an inert gas supply pipe 122c. The flow rate of the $N_2$ gas flowing through the inert gas supply pipe 122c is adjusted by an MFC 124c. The flow-rate-adjusted $N_2$ gas joins with the TEMAZ gas and is exhausted through the exhaust pipe 90 while supplied into the processing chamber 80. The temperature of the heater 72 is set such that the temperature of the wafers 200 (film formation processing temperature) is in a range of, for example, 150 to 250° C.

By the supply of the TEMAZ gas, a layer containing zirconium is formed on a barrier layer of a metal film on a surface of each wafer 200. Namely, a Zr layer serving as a Zr-containing layer which is less than one atomic layer to several atomic layers is formed on the wafer 200 (on the barrier layer of the metal film). The zirconium-containing layer may be a TEMAZ-chemisorbed (surface-adsorbed) layer. Note that Zr is an element that is a solid by itself. Here, a layer having a thickness of less than one atomic layer refers to an atomic layer formed discontinuously, and a layer having a thickness of one atomic layer refers to anatomic layer formed continuously.

The Zr layer includes not only a continuous layer composed of Zr, but also a discontinuous layer and a thin film formed of a stack of discontinuous layers. The continuous layer composed of Zr may be referred to as a "thin film". In addition, the TEMAZ-chemisorbed layer includes not only a continuous chemisorbed layer of TEMAZ molecules, but also a discontinuous chemisorbed layer. The thickness of the Zr-containing layer is preferably less than one atomic layer to several atomic layers.

(Purging Process S340)

Next, a gas remaining in the processing chamber 80 is removed. After forming the Zr-containing layer, by closing the valve 108c and opening the valve 118c, the supply of a TEMAZ gas into the processing chamber 80 is stopped and a TEMAZ gas is allowed to flow through the vent line 110c.

At this time, with the APC valve 94 of the exhaust pipe 90 left open, the inside of the processing chamber 80 is vacuum-exhausted by the vacuum pump 96 to eliminate a TEMAZ gas remaining in the processing chamber 80 that is unreacted or that has contributed to the Zr-containing layer formation, out of the processing chamber 80. At this time, with the valve 128c left open, the supply of an $N_2$ gas into the processing chamber 80 is maintained.

($O_3$ Supply Process S350)

Next, as an oxidation gas, an $O_3$ gas is supplied into the processing chamber 80. After removing a remaining gas in the processing chamber 80, an $O_2$ gas is allowed to flow through a gas supply pipe 102d. The $O_2$ gas flowing through the gas supply pipe 102d turns into an $O_3$ gas by an ozonizer 132.

By opening a valve 134d and a valve 108d of the gas supply pipe 102d and closing a valve 118d of a vent line 110d, the flow rate of the $O_3$ gas generated by the ozonizer 132 is adjusted by an MFC 106d. The flow-rate-adjusted $O_3$ gas is exhausted through the exhaust pipe 90 while supplied into the processing chamber 80 through a gas supply hole 130d of a nozzle 100d.

At this time, by opening a valve 128d, an $N_2$ gas is allowed to flow through an inert gas supply pipe 122d. The flow rate of the $N_2$ gas flowing through the inert gas supply pipe 122d is adjusted by an MFC 124d. The flow-rate-adjusted $N_2$ gas joins with the $O_3$ gas and is exhausted through the exhaust pipe 90 while supplied into the processing chamber 80.

In this process, the gas supplied into the processing chamber 80 is an $O_3$ gas, and a TEMAZ gas is not supplied into the processing chamber 80. Thus, the $O_3$ gas does not cause a gas phase reaction, and reacts with a part of the Zr-containing layer which is formed on each wafer 200 in TEMAZ supply process S330. By this, the Zr-containing layer is oxidized, forming a layer containing Zr and oxygen, i.e., a $ZrO_2$ layer.

Here, the $O_3$ gas which is an oxidation gas acts to strongly oxidize the metal film (in the present embodiment, a TiN film) which is a foundation film. Therefore, when a barrier layer is not formed on a surface of a metal film in the above-described barrier layer formation process, the metal film is excessively oxidized in the present process where an $O_3$ gas is supplied to the wafers 200. Accordingly, the sheet resistance of the metal film increases suddenly, i.e., the performance of a capacitor element decreases. On the other hand, in the present embodiment, since a barrier layer is formed in advance by oxidizing a surface of a metal film in the barrier layer formation process, even in the present process where an $O_3$ gas is supplied to the wafers 200, oxidation of the metal film which is a foundation film can be suppressed. In particular, in the present embodiment, since a barrier layer is formed in the barrier layer formation process such that the amount of increase in the sheet resistance of the metal film is in a range of more than 0% to 100% or less, even in a case of using an oxidizing gas in the capacitive insulating film formation process, the increase in sheet resistance can be controlled to be within a predetermined range.

Note that although the present embodiment describes an example in which an $O_3$ gas is used as an oxidation gas, even when other oxidation gases than an $O_3$ gas are used, likewise, oxidation of the metal film can be suppressed by forming a barrier layer.

(Purging Process S360)

Next, a gas remaining in the processing chamber 80 is removed. By closing the valve 108d of the gas supply pipe 102d and opening the valve 118d, the supply of an $O_3$ gas into the processing chamber 80 is stopped and an $O_3$ gas is allowed to flow through the vent line 110d.

At this time, with the APC valve 94 of the exhaust pipe 90 left open, the inside of the processing chamber 80 is vacuum-exhausted by the vacuum pump 96 to eliminate an $O_3$ gas remaining in the processing chamber 80 that is unreacted or that has contributed to the oxidation, out of the processing chamber 80. At this time, with the valve 128d left open, the supply of an $N_2$ gas into the processing chamber 80 is maintained. The $N_2$ gas acts as a purge gas and thus a gas remaining in the processing chamber 80 is removed from the processing chamber 80 (purging).

(Determination as to a Predetermined Number of Times S370)

Next, with S330 to S360 being one cycle, it is determined whether this cycle has been performed a predetermined number of times. If the cycle has been performed a predetermined number of times, processing proceeds to the next step. If the cycle has not been performed a predetermined number of times, processing proceeds to TEMAZ supply process S330.

As such, by performing a cycle of S330 to S360 at least one time, a $ZrO_2$ film having a predetermined film thickness and containing Zr and oxygen can be formed on the barrier layer of the metal film formed on each wafer 200. It is preferred to repeat the cycle of S330 to S360 a plurality of times.

(Temperature Lowering/Atmospheric Pressure Bringing Back Process S380)

When the process of forming an insulating film ends, the pressure in the processing chamber 80 whose inside atmosphere is replaced by an $N_2$ gas is brought back to atmospheric pressure (bringing back to atmospheric pressure).

(Substrate Unloading Process S390)

Thereafter, a seal cap 48 is lowered by the boat elevator 44, by which a lower end of a reaction tube 74 is opened and the processed wafers 200 are unloaded (boat-unloaded) to the outside from the lower end of the reaction tube 74 with the processed wafers 200 retained in the boat 38.

Subsequently, the processed wafers 200 are taken out of the boat 38 by a wafer transfer apparatus (wafer discharging).

As described above, by performing a barrier layer formation process and a capacitive insulating film formation process, a barrier layer is formed on a surface of a metal film (in the present embodiment, a TiN film) formed on a wafer 200, and a capacitive insulating film (in the present embodiment, a $ZrO_2$ film) having a predetermined film thickness is further formed on the barrier layer.

(3) Effects According to the Present Embodiment

According to the present embodiment, one or a plurality of effects shown below are obtained.

(a) According to the present embodiment, by forming an oxide layer on a surface of a metal film, the oxide layer can serve as a barrier film that suppresses oxidation of the metal film in a subsequent thin film formation process.

(b) In addition, according to the present embodiment, by using plasma, oxidation can be performed at a low temperature (150° C. or less; for example, about 100° C.) compared to a case of not using plasma.

(c) In addition, according to the present embodiment, by containing hydrogen, a defect fixing effect by and oxidation by OH* occur, enabling to form an oxide layer with close-packed film quality.

(d) According to the present embodiment, by forming an oxide layer on a surface of a metal film, the oxide layer serves as a barrier layer, enabling to suppress oxidation of a foundation-metal-containing layer caused by an oxidizing gas.

(e) According to the present embodiment, by forming such an oxide layer (barrier layer) that increases sheet resistance, excessive oxidation of a metal film in a subsequent thin film formation process can be securely prevented.

(f) According to the present embodiment, by setting the amount of increase in sheet resistance to 100% or less, an oxide layer serving as a barrier layer can be formed without impairing the above-described characteristics of a metal film as an electrode.

(g) By setting the mixture ratio of an oxygen gas to a hydrogen gas in the above-described mixed gas such that the hydrogen gas is in a range of 2% or more to 10% or less (the oxygen gas is in a range of 90% or more to 98% or less), an oxide layer can be formed on the above-described metal film such that the amount of increase in sheet resistance is more than 0% and 100% or less.

(h) According to the present embodiment, since the positions of the resonant coil and a substrate can be controlled so as to oxide the side and bottom portions of trenches, the film thicknesses of the side and bottom portions can be controlled to be equivalent to each other so that excellent step coverage can be obtained.

(i) In addition, according to the present embodiment, an electric field formed in the processing chamber 201 is a high-frequency electric field having a frequency according to a trench aspect ratio. Hence, high-density plasma is obtained and the reaching rate of reactive species to the bottom portions of the trenches increases, and in addition, the processing efficiency of the inside of the trenches improves, enabling to perform a finer and higher-speed process.

(j) Radicals such as OH* and H* and non-accelerated ions which are generated by the plasma excitation of a mixed gas of an $O_2$ gas and an $H_2$ gas are slowly and uniformly supplied into trenches in a wafer 200 retained on the susceptor 217 in the substrate processing space 201b. The supplied radicals and ions uniformly react with side walls, modifying a metal film into a silicon oxide film with high step coverage. Furthermore, since ion attack by acceleration can be prevented, wafer damage caused by ions can be suppressed.

(k) Since ion acceleration is prevented, there is no sputtering action on a peripheral wall of the plasma generation space, and accordingly, damage to the peripheral wall of the plasma generation space does not occur. As a result, the apparatus life can be improved. Moreover, a problem that the member components of the plasma generation space, etc., mix in plasma, contaminating a wafer can also be prevented.

(l) The frequency matching box 274 placed along the high-frequency power supply 273 compensates for reflected-wave power caused by impedance mismatching occurring in the resonant coil 212, on the high-frequency power supply 273 side to complement a reduction in effective load power. Thus, high-frequency power at an initial level can be securely supplied to the resonant coil 212 at all times, and plasma can be stabilized. Accordingly, a wafer retained in the substrate processing space can be processed uniformly at a constant rate.

(m) By lower power (about 5 kW in normal times) and shorter processing time than in normal times, excessive oxidation of a metal-containing layer is avoided, enabling to control the amount of increase in the sheet resistance of the metal film.

Figure 8:
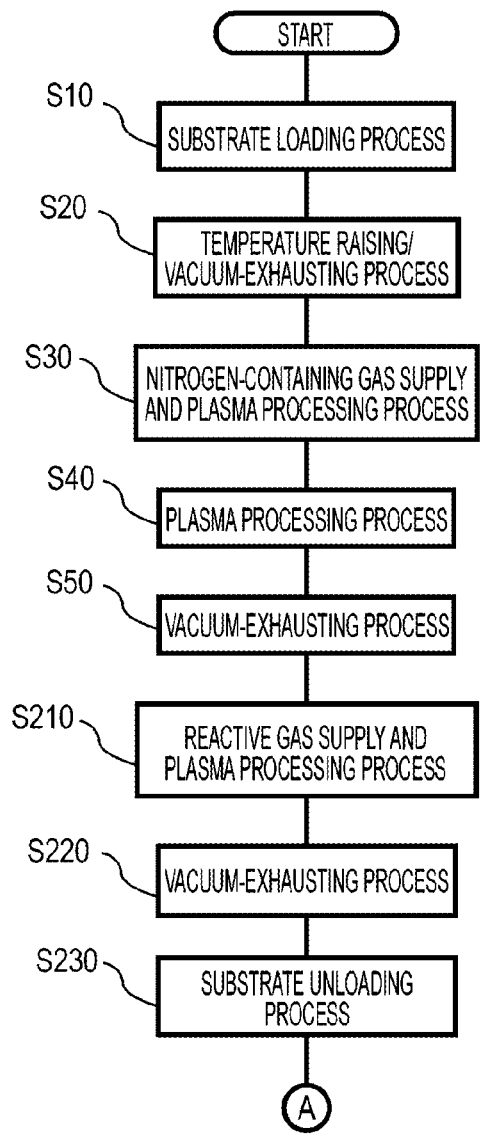
FIG. 8 is a flowchart showing a substrate processing process according to a second embodiment.
Figure 8:
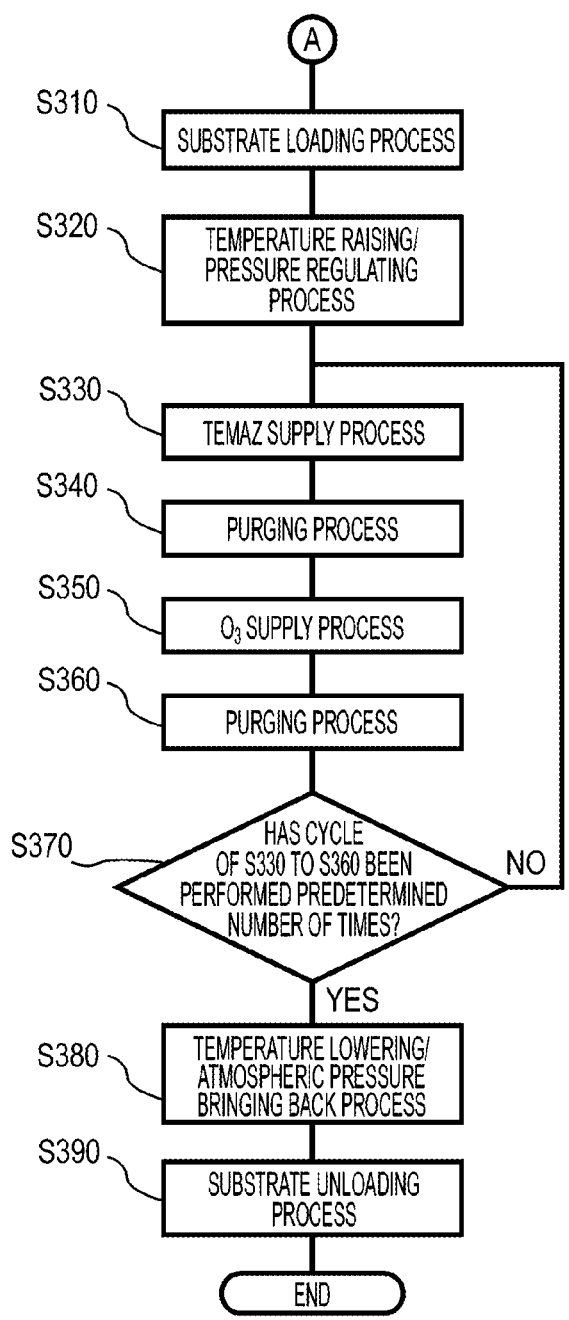

As a second embodiment, an embodiment in which nitriding is performed on a TiN film before a barrier layer formation process that performs oxidizing of the TiN film (the first embodiment) will be described using FIG. 8. Note that, as in the first embodiment, the present embodiment is performed using the processing apparatus 100.

<<Nitriding Process>>

(Substrate Loading Process S10 and Temperature Raising/Vacuum-Exhausting Process S20)

First, a wafer 200 having a TiN film, which serves as a bottom electrode 4, formed on a surface thereof is loaded into the processing chamber 201. Other operation is the same as that in substrate loading process S110 and temperature raising/vacuum-exhausting process S120 in the first embodiment.

(Nitrogen-Containing Gas Supply and Plasma Processing Process S30)

Next, a supply of a mixed gas of an $H_2$ gas and an $N_2$ gas which serves as a nitrogen-containing gas starts. Specifically, as follows.

(Mixed-Gas Flow Rate Control Process)

By opening the valves 243a, 253b, and 253c, a mixed gas of an $H_2$ gas and an $N_2$ gas is introduced (supplied) into the processing chamber 201 through the buffer chamber 237. The MFCs 252b and 252c are controlled such that the mixture ratio of an $N_2$ gas to an $H_2$ gas in the mixed gas of an $H_2$ gas and an $N_2$ gas reaches a predetermined ratio where the $N_2$ gas is in a range of 10% or more to 90% or less (i.e., the $H_2$ gas is in a range of 10% or more to 90% or less), preferably, the $N_2$ gas is in a range of 33% or more to 67% or less (i.e., the $H_2$ gas is in a range of 33% or more to 67% or less) in order to sufficiently obtain the effects of the $N_2$ gas and $H_2$ gas. In the present embodiment, the mixed gas is supplied such that the $N_2$ gas is 50% and the $H_2$ gas is 50%. Upon supplying, an $H_2$ gas may be introduced into the processing chamber 201 before supplying the mixed gas, to regulate the inside of the processing chamber 201 to have a predetermined pressure. By doing so, upon a start of a mixed-gas supply, sudden nitridation of the bottom electrode 4 can be suppressed, with the pressure in the processing chamber 201 maintained.

In addition, the degree of opening of the APC valve 242 is adjusted such that the pressure in the processing chamber 201 after supplying the mixed gas reaches a predetermined pressure, e.g., 15 Pa or more and 250 Pa or less (in the present embodiment, 120 Pa).

After a lapse of a predetermined period of time (e.g., after a lapse of several seconds) from the start of introduction of the mixed gas, application of high-frequency power to the resonant coil 212 from the high-frequency power supply 273 starts. By this, a high-frequency electric field is formed in the plasma generation space 201a, and by the electric field, induced plasma is excited in the plasma generation space 201a. The properties of plasma to be excited are the same as those in the first embodiment. The $N_2$ gas and $H_2$ gas in plasma form are dissociated, generating reactive species, e.g., nitrogen radicals (active species) such as NH* containing nitrogen (N) and hydrogen (H), nitrogen ions, hydrogen radicals (active species) such as H*, and hydrogen ions.

Thereafter, when predetermined processing time, e.g., 10 seconds to 300 seconds, preferably, 30 seconds to 120 seconds taking into account throughput, the time required for a process to be stabilize, etc., has elapsed, the output of power from the high-frequency power supply 273 is stopped to stop the plasma discharge in the processing chamber 201. In addition, by closing the valves 243a, 253b, and 253c, the supply of an $N_2$ gas and an $H_2$ gas into the processing chamber 201 is stopped. By the above, the plasma processing process S40 ends.

(Vacuum-Exhausting Process S50)

When the predetermined processing time has elapsed and the supply of an $N_2$ gas and an $H_2$ gas is stopped, the inside of the processing chamber 201 is vacuum-exhausted using the gas exhaust pipe 231. By this, an $N_2$ gas, an $H_2$ gas, and other exhaust gases generated by the nitriding in the processing chamber 201 are exhausted out of the processing chamber 201.

After performing nitriding on the surface of the TiN film in the above-described nitriding process, a barrier layer formation process described in the first embodiment, more specifically, processes at S210 to S390, is performed. The nitriding process and barrier layer formation process of the present embodiment do not include therebetween a process of unloading and loading a wafer 200, and are sequentially performed in the processing chamber 201 of the processing apparatus 100 without unloading the wafer 200 from the processing chamber 201. Thereafter, furthermore, the processing apparatus 40 performs a capacitive insulating film formation process.

The reason that a TiN film is subjected to nitriding before a barrier layer formation process in the present embodiment is as follows. By performing the above-described nitriding on a metal nitride film such as a TiN film, a uniform, close-packed nitride layer is formed on a surface of the metal nitride film. Since the nitride layer suppresses diffusion of oxygen into the metal nitride film in a subsequent barrier layer formation process, a thinner and more uniform oxide layer is formed only near a surface of the metal nitride film. A barrier layer formed of the thin, uniform oxide layer can obtain a high effect in its function of suppressing oxidation against an oxidation gas in a subsequent capacitive insulating film formation process, etc., while maintaining the sheet resistance at a low level. Namely, even if a barrier layer has a sheet resistance maintained at a low level, the barrier layer can suppress oxidation of the metal nitride film caused by an oxidation gas in a subsequent process.

More specifically, when the metal nitride film is a TiN film, a layer of titanium oxynitride (TiON) may be formed by natural oxidation on a surface of the TiN film before being subjected to a nitriding process. In the present embodiment, the TiON layer is modified into a TiN layer in a nitriding process, and an oxide layer serving as a uniform, close-packed barrier layer, i.e., a layer of titanium oxide (TiO), is formed in a subsequent barrier layer formation process. Since the uniform, close-packed TiO layer can be formed on the surface, oxidation of the metal nitride film in a subsequent capacitive insulating film formation process, etc., can be suppressed while the increase in the sheet resistance of the metal nitride film is suppressed to a low value.

In addition, in the nitriding process of the present embodiment, by using reactive species such as H* generated by the plasma excitation of a mixed gas containing an $H_2$ gas, a natural oxide layer formed on the surface of the metal nitride film can be reduced and impurities in the metal nitride film can be removed. Therefore, as a result, the sheet resistance of the metal nitride film can be reduced. In addition, since the sheet resistance of the metal nitride film is reduced by reactive species such as H*, and a uniform, close-packed nitride layer is further formed on the surface of the metal nitride film by reactive species containing nitrogen such as NH*, the sheet resistance can be changed to be equivalent to that of the metal nitride film before subjected to nitriding, or to be suppressed to a value lower than that.

In addition, in the present embodiment, since a nitriding process and a barrier layer formation process are sequentially performed in the processing chamber 201, a wafer 200 can be prevented from being naturally oxidized by the exposure to atmosphere, etc., between the two processes. In addition, since the two processes can be performed sequentially, a good-quality barrier layer can be formed without reducing the throughput of substrate processing.

In addition, for a condition for nitriding a TiN film, a process using a mixed gas of $H_2$ and $N_2$ is desirable. This is because when a TiN film is modified, reactive species containing hydrogen such as H* have the effects of reducing naturally-oxidized TiON on a surface of the TiN film into TiN, and removing impurities in the film. This is also verified from a reduction in sheet resistance.

Figure 9:
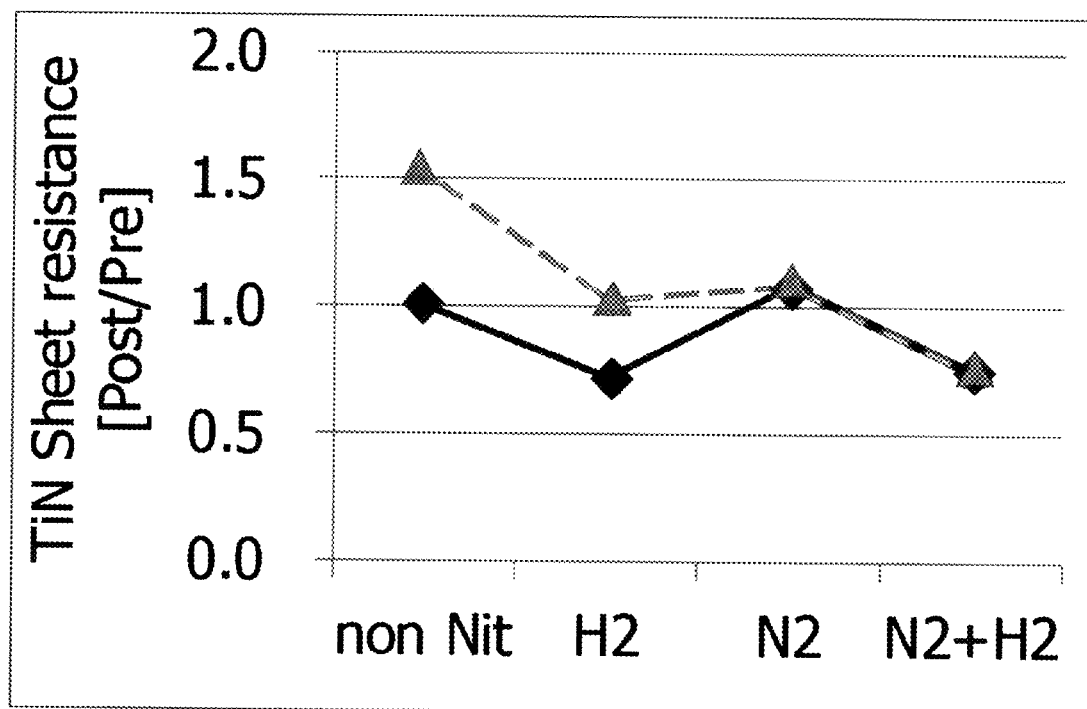
FIG. 9 is a diagram showing changes in sheet resistance for when a TiN film is not subjected to any process and for when subjected to an $H_2$ process, an $N_2$ process, and an $H_2+N_2$ process, and changes in sheet resistance for when oxidizing is performed thereafter.

FIG. 9 shows the sheet resistances, by square points (black line), for a case of performing no process on a TiN film (non Nit), for a case of performing plasma processing using only an $H_2$ gas ($H_2$), for a case of performing plasma processing using only an $N_2$ gas ($N_2$), and for a case of performing plasma processing using a mixed gas of an $H_2$ gas and an $N_2$ gas ($H_2+N_2$). In addition, the sheet resistances obtained when oxidizing in a barrier film formation process is performed after each processing are shown by triangle points (dashed line).

In the case of performing no process (non Nit), assuming that the initial value is 1.0, the sheet resistance is changed to 1.5 by performing oxidizing in a barrier film formation process. In the case of performing plasma processing using only an $H_2$ gas ($H_2$), it can be seen that the sheet resistance is improved to about 0.75. Note, however, that it can be seen that by performing oxidizing in a barrier film formation process thereafter, the sheet resistance gets back to nearly the initial value.

On the other hand, by replenishing nitrogen on the surface of the TiN film by performing plasma processing using an $N_2$ gas, a more uniform, close-packed TiN layer with excellent oxidation resistance can be formed. This is demonstrated from the fact that even if the TiN film is subjected to oxidizing after subjected to plasma processing using an $N_2$ gas, there is no increase in sheet resistance. Taking a look at the case of performing plasma processing using only an $N_2$ gas ($N_2$) shown in FIG. 9, it can be seen that even if plasma processing is performed using only an $N_2$ gas, the sheet resistance is not improved. However, it can also be seen that even if oxidizing in a barrier film formation process is performed thereafter, the sheet resistance is not deteriorated.

As such, plasma processing using an $H_2$ gas has a reduction effect and an impurity removing effect, and plasma processing using an $N_2$ gas has an effect of enhancing the oxidation resistance of the TiN film. As shown in FIG. 9, in the case of performing plasma processing using a mixed gas of an $H_2$ gas and an $N_2$ gas ($H_2+N_2$), the sheet resistance is improved to about 0.75, and moreover, the sheet resistance is not deteriorated even after subsequent oxidizing. Namely, it can be seen that the effects brought about by plasma processing using an $H_2$ gas and plasma processing using an $N_2$ gas can be simultaneously obtained.

(3) Effects According to the Present Embodiment

According to the present embodiment, one or a plurality of effects shown below are provided.

(a) By further forming a uniform, close-packed nitride layer on a surface of a metal nitride film, diffusion of oxygen into the metal nitride film in a subsequent oxide layer formation process is suppressed, facilitating the formation of a thinner and more uniform oxide layer near the surface of the metal nitride film. Therefore, even after performing oxidizing in a barrier layer formation process, while the increase in sheet resistance is suppressed to a low value, oxidation of the metal nitride film (increase in sheet resistance) in a subsequent process using an oxidizing gas can be suppressed.

(b) By using plasma for nitriding, nitridation can be efficiently performed at a high rate even at a low processing temperature. For an apparatus to be used, particularly, a plasma substrate processing apparatus used in the present embodiment is suitable.

(c) By using hydrogen plasma, a naturally oxidized layer on a surface of a metal nitride film can be reduced, and impurities in the metal nitride film can be removed. Therefore, as a result, the sheet resistance of the metal nitride film can be reduced. In addition, since the sheet resistance of the metal nitride film is reduced by hydrogen plasma and a uniform, close-packed nitride layer is further formed on the surface of the metal nitride film by nitrogen plasma, the sheet resistance can be suppressed to that of the metal nitride film before subjected to nitriding or to a value lower than that.

(d) Since nitriding and oxidizing are sequentially performed in the same apparatus, processes can be reduced and thus throughput can be improved. In addition, unwanted natural oxidation can be prevented from occurring after nitriding.

(e) Nitriding can be performed with excellent step coverage characteristics.

(f) By nitriding of a TiN film, the film quality of the TiN film can be improved and the oxidation resistance of the TiN film can be enhanced.

(g) By using a plasma substrate processing apparatus having a configuration of the present embodiment for nitriding, nitridation can be efficiently performed at a high rate even at a low processing temperature.

Note that although in the above-described first and second embodiments, as a capacitive insulating film formation process, a method of forming a capacitive insulating film by alternately supplying a source gas and an oxidation gas is used, the present invention is not limited thereto and may be applied to various film formation methods such as a CVD method using an oxidizing gas. Note also that although the above-described first and second embodiments describe the processes related to the formation of a metal electrode and a capacitive insulating film, the present invention is not limited thereto and may be applied to a process of forming a film on a metal film, particularly, a metal nitride film, using an oxidizing gas.

Note also that although in the above-described first and second embodiments, a nitriding process and a barrier layer formation process, and a capacitive insulating film formation process are performed by different processing apparatuses (i.e., the processing apparatus 100 and the processing apparatus 40), a single processing system may be formed using those processing apparatuses as components. For example, in a cluster-type substrate processing system including a plurality of substrate processing apparatuses (substrate processing chambers), a substrate processing apparatus that performs a nitriding process and a barrier layer formation process and a substrate processing apparatus that performs a capacitive insulating film formation process may be provided, and the processes may be sequentially performed in the substrate processing system.

In addition, the techniques of the above-described embodiments and variants can be applied to a process of manufacturing a dynamic random access memory (DRAM) which is a volatile semiconductor memory device (volatile memory). In addition, the techniques of the above-described embodiments and variants can also be applied to a process of manufacturing a flash memory which is a nonvolatile semiconductor memory device (nonvolatile memory). For example, the techniques of the above-described embodiments and variants can also be applied to a process of manufacturing a NAND flash memory which is a type of flash memory, e.g., a three-dimensional NAND flash memory (3D NAND). Note that the three-dimensional NAND flash memory can also be simply referred to as a three-dimensional flash memory (three-dimensional non-volatile semiconductor memory device).

What is claimed is:

1. A method of manufacturing a semiconductor device comprising:
    preparing a substrate having a metal nitride film formed on a surface thereof;
    performing nitriding on the metal nitride film;
    forming an oxide layer by oxidizing a surface of the metal nitride film by plasma of a mixed gas of an oxygen-containing gas and a hydrogen-containing gas after the performing of nitriding on the metal nitride film; and
    forming a thin film on the oxide layer by supplying an oxidizing gas to the substrate.

2. The method according to claim 1, wherein the oxygen-containing gas is oxygen gas and the hydrogen-containing is hydrogen gas.

3. The method according to claim 2, wherein a mixture ratio of the hydrogen gas in the mixed gas is such that a percentage of the hydrogen gas is in a range of 2% or more to 100% or less.

4. The method according to claim 1, wherein the metal nitride film is a conductive metal nitride film.

5. The method according to claim 1, wherein the thin film is a film formed of an oxide.

6. The method according to claim 1, wherein the thin film is a film formed of at least one selected from the group consisting of AlO, ZrO, HfO, ZrAlO, HfAlO, and SrTiO.

7. The method according to claim 1, wherein in the forming of an oxide layer, the oxide layer is formed such that a sheet resistance of the metal nitride film after subjected to the forming and having formed thereon the oxide layer is increased over a sheet resistance of the metal nitride film before subjected to the forming.

8. The method according to claim 7, wherein an amount of the increase in the sheet resistance of the metal nitride film in the forming of an oxide layer is in a range of more than 0% to 100% or less.

9. The method according to claim 1, wherein in the performing of nitriding on the metal nitride film, a surface of the metal nitride film is nitrided by plasma of a nitrogen-containing gas.

10. The method according to claim 1, wherein in the performing of nitriding on the metal nitride film, a surface of the metal nitride film is nitrided by plasma of a gas containing nitrogen and hydrogen.

11. The method according to claim 10, wherein the gas containing nitrogen and hydrogen is a mixed gas of a nitrogen gas and a hydrogen gas.

12. The method according to claim 10, wherein the gas containing nitrogen and hydrogen is an ammonia gas.

13. The method according to claim 1, wherein the metal nitride film is a titanium nitride film.

14. The method according to claim 1, wherein the performing of nitriding on the metal nitride film and the forming of an oxide layer are sequentially performed in a processing chamber.

15. A non-transitory computer-readable recording medium having recorded therein a program causing a computer to allow a substrate processing apparatus to:
    prepare a substrate having a metal nitride film formed on a surface thereof;
    perform nitriding on the metal nitride film;
    form an oxide layer by oxidizing a surface of the metal nitride film by plasma of a mixed gas of an oxygen-containing gas and a hydrogen-containing gas after the performing of nitriding on the metal nitride film; and
    form a thin film on the oxide layer by supplying an oxidizing gas to the substrate.

16. The recording medium according to claim 15, wherein the thin film is a film formed of an oxide.

17. The recording medium according to claim 15, wherein in the forming of an oxide layer, the oxide layer is formed such that a sheet resistance of the metal nitride film after subjected to the forming and having formed thereon the oxide layer is increased over a sheet resistance of the metal nitride film before subjected to the forming.

* * * * *